United States Patent [19]
Evans, Jr.

[11] Patent Number: 5,232,747
[45] Date of Patent: Aug. 3, 1993

[54] PLATINUM-ALUMINUM CONNECTION SYSTEM

[75] Inventor: Joseph T. Evans, Jr., Albuquerque, N. Mex.

[73] Assignee: Radiant Technologies, Albuquerque, N. Mex.

[21] Appl. No.: 920,258

[22] Filed: Jul. 27, 1992

[51] Int. Cl.⁵ .......................... B05D 3/06; B05D 5/12
[52] U.S. Cl. ..................................... 427/539; 427/576; 427/96; 427/123; 427/125; 427/126.5
[58] Field of Search ................. 427/539, 564, 574, 96, 427/125, 123, 126.5

[56] References Cited

U.S. PATENT DOCUMENTS

| | | | |
|---|---|---|---|
| 3,632,498 | 2/1968 | Beer | 427/126.5 |
| 4,276,144 | 6/1981 | Hahn et al. | 427/488 |
| 4,323,589 | 4/1982 | Ray et al. | 427/539 |
| 4,390,405 | 6/1983 | Hahn et al. | 427/488 |
| 4,765,864 | 8/1988 | Holland et al. | 204/242 |
| 5,110,441 | 5/1992 | Kinlen et al. | 204/435 |
| 5,164,808 | 11/1992 | Evans, Jr. et al. | 361/305 |

*Primary Examiner*—Marianne Padgett
*Attorney, Agent, or Firm*—McCubbrey, Bartels, Meyer & Ward

[57] ABSTRACT

An improved method for making aluminum connections to platinum electrodes is described. The method utilizes an oxide layer to isolate the aluminum from the platinum. The oxide layer is created by ashing the surface of the platinum using an Oxygen plasma.

2 Claims, 1 Drawing Sheet

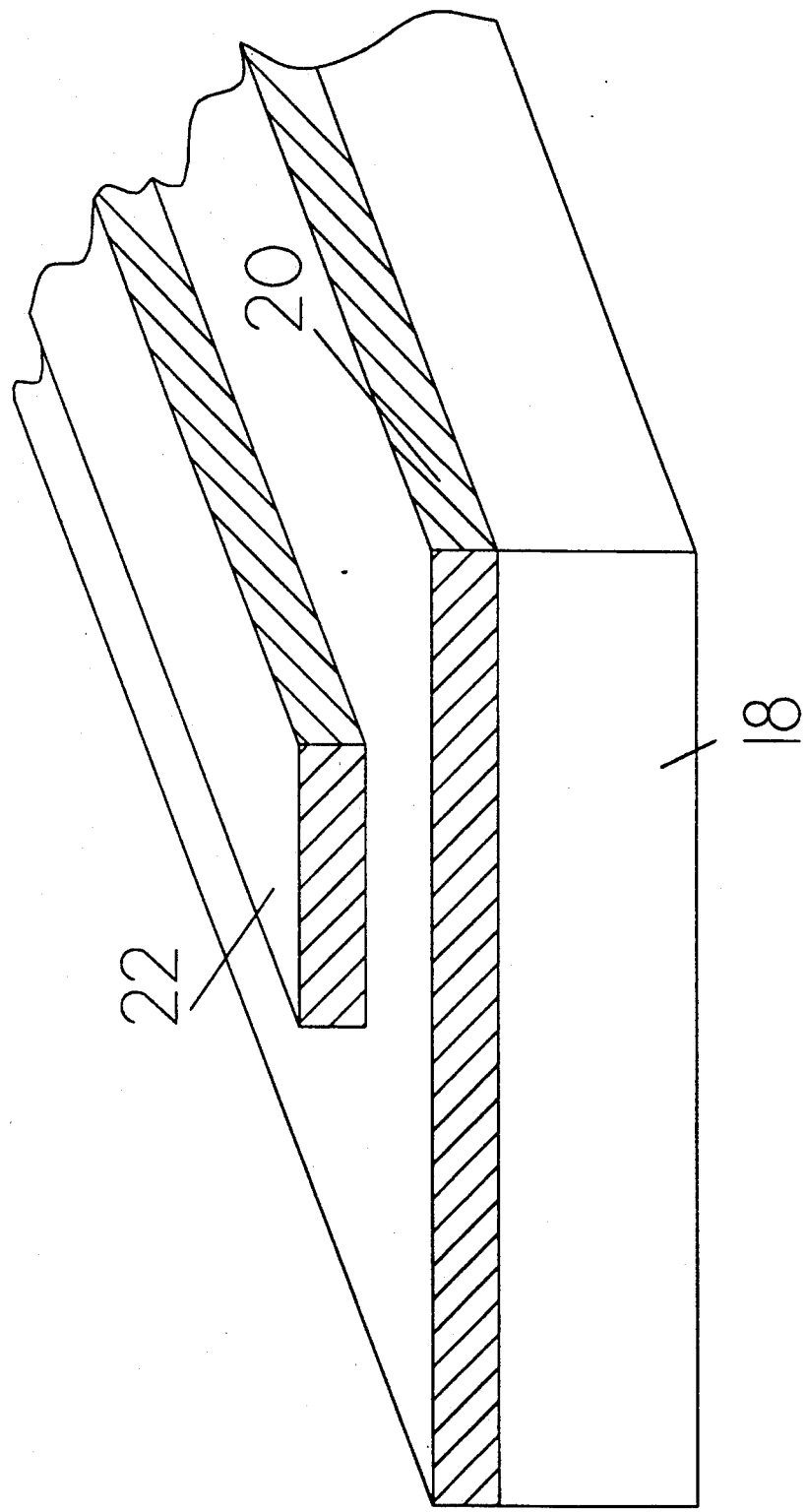

PLATINUM-ALUMINUM CONNECTION SYSTEM

FIELD OF THE INVENTION

The present invention relates to semiconductor manufacturing techniques, and more particularly, to an improved method for making aluminum connections to platinum electrodes in semiconductor devices and the like.

BACKGROUND OF THE INVENTION

There are a number of situations in which aluminum metalization used for signal and power conductors in semiconductors devices must be applied to a platinum electrode. For example, ferroelectric capacitors for use in semiconductor devices typically comprise a ferroelectric material sandwiched between two electrodes. It is advantageous to use platinum for the electrodes. The signal connections in many semiconductor devices are constructed by depositing aluminum. However, aluminum cannot be deposited directly on platinum, as electrochemical reactions between the aluminum and the platinum will destroy the deposited aluminum layer.

One prior art solution to this problem utilizes a layer of titanium nitride to isolate the platinum from the aluminum. The titanium nitride is deposited by a sputtering technique that leads to deformities such as "bumps" in the titanium nitride layer. It is difficult to obtain a uniform aluminum layer in the presence of these deformities.

Broadly, it is the object of the present invention to provide an improved platinum-aluminum interconnect system.

It is a further object of the present invention to provide an improved platinum-aluminum interconnect system that provide a superior platinum binding surface for subsequent aluminum deposition.

These and other objects of the present invention will become apparent to those skilled in the art from the following detailed description of the invention and the accompanying drawings.

SUMMARY OF THE INVENTION

The present invention comprises a method for making an aluminum connection to a platinum electrode. In the present invention, the surface of the platinum electrode is first oxidized to form a layer of $PtO_2$. The aluminum is then deposited on the $PtO_2$ layer.

BRIEF DESCRIPTION OF THE DRAWINGS

FIG. 1 illustrates the deposition of an aluminum layer on a platinum substrate using the method of the present invention.

DETAILED DESCRIPTION OF THE INVENTION

The present invention is based on the observation that $PtO_2$ provides a chemically inert substrate for the deposition of aluminum. The $PtO_2$ is generated by oxidizing the surface of the platinum layer that is to become the substrate for the aluminum deposition. The $PtO_2$ isolates the aluminum from the platinum as shown in FIG. 1.

A $PtO_2$ layer 20 having a thickness of approximately 0.01 mm is generated on the surface of a platinum electrode 18 by ashing the surface of electrode 18. An aluminum interconnect 22 may then be deposited on layer 20. In the preferred embodiment of the present invention, the surface of electrode 18 is exposed to an oxygen plasma for at least 10 minutes at a power of approximately 150 mW ad a pressure of approximately 200 mTorr. In one embodiment of the present invention, a Techniques Plasma Etcher Model 750 was utilized for the ashing step. The $PtO_2$ acts as a buffer/passivation layer creating a fully conductive inert oxide interface. The $PtO_2$ layer lacks the deformities that interfered with aluminum deposition in prior art methods; hence, the present invention provides a superior surface for the deposition of the aluminum metalization 22.

There has been described herein a system for making aluminum connections to platinum electrodes. Various modifications to the present invention will become apparent to those skilled in the art from the foregoing description and accompanying drawings. Accordingly, the present invention is to be limited solely by the scope of the following claims.

What is claimed is:

1. A method for making an aluminum connection to a platinum electrode comprising the steps of:
   oxidizing the surface of said platinum electrode; and
   depositing aluminum on said oxidized surface.
2. The method of claim 1 wherein said oxidizing step comprises exposing said surface of said Platinum electrode to an Oxygen plasma.

* * * * *